(12) United States Patent
Zuo

(10) Patent No.: US 10,998,253 B1
(45) Date of Patent: May 4, 2021

(54) FLUID DIVERTING HEAT SINK

(71) Applicant: Google LLC, Mountain View, CA (US)

(72) Inventor: Xu Zuo, Saratoga, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/725,330

(22) Filed: Dec. 23, 2019

(51) Int. Cl.
H01L 23/46 (2006.01)
F28F 3/02 (2006.01)
H05K 7/20 (2006.01)
H01L 23/367 (2006.01)

(52) U.S. Cl.
CPC .............. *H01L 23/46* (2013.01); *F28F 3/027* (2013.01); *H01L 23/3672* (2013.01); *H05K 7/20163* (2013.01); *F28F 2215/00* (2013.01)

(58) Field of Classification Search
CPC .............. H01L 23/467; H01L 23/3672; H05K 7/20145; H05K 7/20154; H05K 7/20163; H05K 7/20854; H05K 7/20863; H05K 7/20909; H05K 7/20918; F28D 2021/0028; F28D 2021/0029; F28F 3/02; F28F 3/027; F28F 13/06; F28F 2215/00; F28F 2215/08; F28F 2215/10; F28F 2250/10; F28F 2250/102; F28F 9/0268; F28F 2009/228; F28F 2250/02
USPC ................................. 165/80.3, 185
See application file for complete search history.

(56) References Cited

U.S. PATENT DOCUMENTS

| | | | | |
|---|---|---|---|---|
| 5,040,596 A | * | 8/1991 | Terasaki | F28D 9/0062 165/166 |
| 5,077,601 A | * | 12/1991 | Hatada | H01L 23/467 257/722 |
| 5,224,538 A | * | 7/1993 | Jacoby | B01D 1/22 165/166 |
| 5,957,194 A | * | 9/1999 | Azar | F28F 13/06 165/80.3 |
| 6,085,830 A | * | 7/2000 | Mashiko | B22D 17/24 165/185 |
| 6,161,610 A | * | 12/2000 | Azar | H01L 23/467 165/80.3 |

(Continued)

FOREIGN PATENT DOCUMENTS

| | | |
|---|---|---|
| JP | H01-204498 | 8/1989 |
| JP | 2001-118972 | 4/2001 |
| JP | 2005-079349 | 3/2005 |

OTHER PUBLICATIONS

Anonymous [online], "Heat sink" Nov. 2019, [retrieved Nov. 14, 2019], retrieved from URL <https://en.wikipedia.org/wiki/Heat_sink>, 17 pages.

(Continued)

*Primary Examiner* — Jianying C Atkisson
*Assistant Examiner* — Jose O Class-Quinones
(74) *Attorney, Agent, or Firm* — Fish & Richardson P.C.

(57) ABSTRACT

A heat sink with a base defining a first side having a base planar surface, and a plurality of planar fins extending from the base planar surface in parallel disposition relative to each other. Each planar fin has a bottom fin edge, a top fin edge, and a leading fin edge. Each planar fin has a fin planar surface and one or more control surfaces. Each of the one or more control surfaces extends from the fin planar surface and is disposed relative to the fin planar surface, the bottom fin edge, and the top fin edge such that a fluid flowing from the leading fin edge is conducted toward the base planar surface.

12 Claims, 5 Drawing Sheets

(56) References Cited

U.S. PATENT DOCUMENTS

| | | | |
|---|---|---|---|
| 6,330,157 B1 * | 12/2001 | Bezama | H01L 23/473 |
| | | | 361/704 |
| 6,590,770 B1 | 7/2003 | Rogers et al. | |
| 6,845,812 B2 | 1/2005 | Turocy et al. | |
| 8,561,451 B2 * | 10/2013 | Opferkuch | F28F 3/046 |
| | | | 72/379.6 |
| 2003/0155110 A1 * | 8/2003 | Joshi | F28F 3/02 |
| | | | 165/185 |
| 2004/0200608 A1 * | 10/2004 | Baldassarre | F28D 15/02 |
| | | | 165/181 |
| 2004/0261975 A1 | 12/2004 | Kozyra et al. | |
| 2006/0102325 A1 | 5/2006 | Li et al. | |
| 2010/0170657 A1 | 7/2010 | Kaslusky | |
| 2011/0079370 A1 | 4/2011 | Wen et al. | |
| 2014/0262194 A1 * | 9/2014 | Hernon | H01L 23/467 |
| | | | 165/185 |

OTHER PUBLICATIONS

Simons [online], "Estimating Parallel Plate-Fin Heat Sink Thermal Resistance" Feb. 2003, [retrievef on Nov. 14, 2019], retrieved from: URL <https://www.electronics-cooling.com/2003/02/estimating-parallel-plate-fin-heat-sink-thermal-resistance/>, 11 pages.

Ventola et al, "Rough surfaces with enhanced heat transfer for electronics coiling by direct metal laser sintering" International Journal of Heat and Mass Transfer, Apr. 2014, 17 pages.

European Extended Search Report in European Application No. 20191686.3, dated Feb. 24, 2021, 9 pages.

\* cited by examiner

FLUID DIVERTING HEAT SINK

TECHNICAL FIELD

This specification relates generally to providing cooling to electronic equipment.

BACKGROUND

Electronic devices generate heat through power consumption. Excessive heat generation without sufficient cooling can lead to damage and failure of electronic devices. Electronic devices may be cooled by cooling systems such as heat sinks. Heat sinks are passive heat exchangers that transfer heat from electronic devices to a fluid medium.

SUMMARY

Heat sinks can be used to cool electronic devices, e.g., processors, memories, network devices, and other heat generating devices. In computing systems, heat sinks can be used to cool central processing units (CPUs), graphics processing units (GPUs), tensor processing units (TPU), chipsets, and random access memory (RAM) modules, and other electronic devices.

A heat sink is a passive heat exchanger that can transfer heat generated by an electronic device to a lower temperature fluid medium, such as air or a liquid coolant. The fluid medium removes and disperses heat from the electronic device. A heat sink can be used to lower or maintain the temperature of the electronic device, preventing the electronic device from overheating.

The amount of heat that can be removed by a heat sink is dependent on various factors, to include the surface area of the heat sink, the fluid volume and velocity through the heat sink, and the direction of fluid flow through the heat sink. Heat sink performance can be improved by increasing the amount of heat that the heat sink removes from the electronic device. Heat sink performance can also be improved by increasing the rate of heat removal from the electronic device.

A heat sink may have a base that is thermally coupled to a heat load, e.g., an electronic device. Due to a close proximity to the heat load, the area of the heat sink that is near the base may experience higher temperatures than other areas of the heat sink. Design features such as fluid control surfaces can be added to a heat sink to divert fluid flow toward the base of the heat sink, increasing air flow in the areas of the heat sink near the base. Increasing fluid flow near the base of the heat sink can reduce temperatures near the base, improving overall heat removal performance of the heat sink.

In general, one innovative aspect of the subject matter described in this specification can be embodied in a heat sink that includes a base defining a first side having a base planar surface and a second side opposite the first side. The heat sink includes a plurality of planar fins extending from the base planar surface in parallel disposition relative to each other. Each planar fin of the plurality of planar fins includes a bottom fin edge coupled to the base planar surface, a top fin edge that is opposite the bottom fin edge, a leading fin edge extending from the bottom fin edge to the top fin edge, a fin planar surface extending from the bottom fin edge to the top fin edge, and one or more control surfaces. The one or more control surfaces extend from the fin planar surface and are disposed relative to the fin planar surface, the bottom fin edge, and the top fin edge such that a fluid flowing from the leading fin edge is conducted toward the base planar surface.

The foregoing and other embodiments can each optionally include one or more of the following features, alone or in combination. In some implementations, for each of the plurality of planar fins, the leading fin edge is defined by a fluid ingress, and the planar fin includes a trailing fin edge opposite the leading fin edge that is defined by a fluid egress.

In some implementations, the one or more control surfaces include a plurality of control surfaces that are arranged along a single row extending from the leading fin edge toward the trailing fin edge. The single row is horizontally disposed relative to the base planar surface.

In some implementations, the plurality of control surfaces are arranged according to a plurality of rows. Each row of the plurality of rows extends from the leading fin edge toward the trailing fin edge and are horizontally disposed relative to the base planar surface. Each row of the plurality of rows is displaced at a vertical distance from the bottom edge different than the respective vertical distance of each other row.

In some implementations, each of the plurality of rows includes a same number of control surfaces.

In some implementations, each of the plurality of rows includes a different number of control surfaces than a respective number of control surfaces of an adjacent row.

In some implementations, each of the one or more control surfaces are mounted at a non-zero angle relative to the plane of the base.

In some implementations, each of the one or more control surfaces in a particular row of the plurality of rows is mounted at a respective angle relative to the plane of the base, and each respective angle for each row is different from the respective angle for each other row.

In some implementations, the plurality of control surfaces are embossed in the fin planar surface.

In some implementations, the plurality of control surfaces are soldered onto the fin planar surface.

In general, one innovative aspect of the subject matter described in this specification can be embodied in a planar fin that includes a bottom fin edge, a top fin edge that is opposite the bottom fin edge, a leading fin edge extending from the bottom fin edge to the top fin edge, and a fin planar surface extending from the bottom fin edge to the top fin edge. The planar fin includes one or more control surfaces extending from the fin planar surface and disposed relative to the fin planar surface, the bottom fin edge, and the top fin edge such that a fluid flowing from the leading fin edge is conducted toward the bottom fin edge.

The foregoing and other embodiments can each optionally include one or more of the following features, alone or in combination. In some implementations, the leading fin edge is defined by a fluid ingress, and the planar fin includes a trailing fin edge opposite the leading fin edge that is defined by a fluid egress.

In some implementations, the one or more control surfaces include a plurality of control surfaces that are arranged along a single row extending from the leading fin edge toward the trailing fin edge. The single row is horizontally disposed relative to the bottom edge.

In some implementations, the plurality of control surfaces are arranged according to a plurality of rows. Each row of the plurality of rows extends from the leading fin edge toward the trailing fin edge and are horizontally disposed relative to the bottom edge. Each row of the plurality of rows is displaced at a vertical distance from the bottom edge different than the respective vertical distance of each other row.

In some implementations, each of the plurality of rows includes a same number of control surfaces.

In some implementations, each of the plurality of rows includes a different number of control surfaces than a respective number of control surfaces of an adjacent row.

In some implementations, each of the one or more control surfaces are mounted at a non-zero angle relative to the bottom edge.

In some implementations, each of the one or more control surfaces in a particular row of the plurality of rows is mounted at a respective angle relative to the bottom edge, and each respective angle for each row is different from the respective angle for each other row.

In some implementations, the plurality of control surfaces are embossed in the fin planar surface.

In some implementations, the plurality of control surfaces are soldered onto the fin planar surface.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
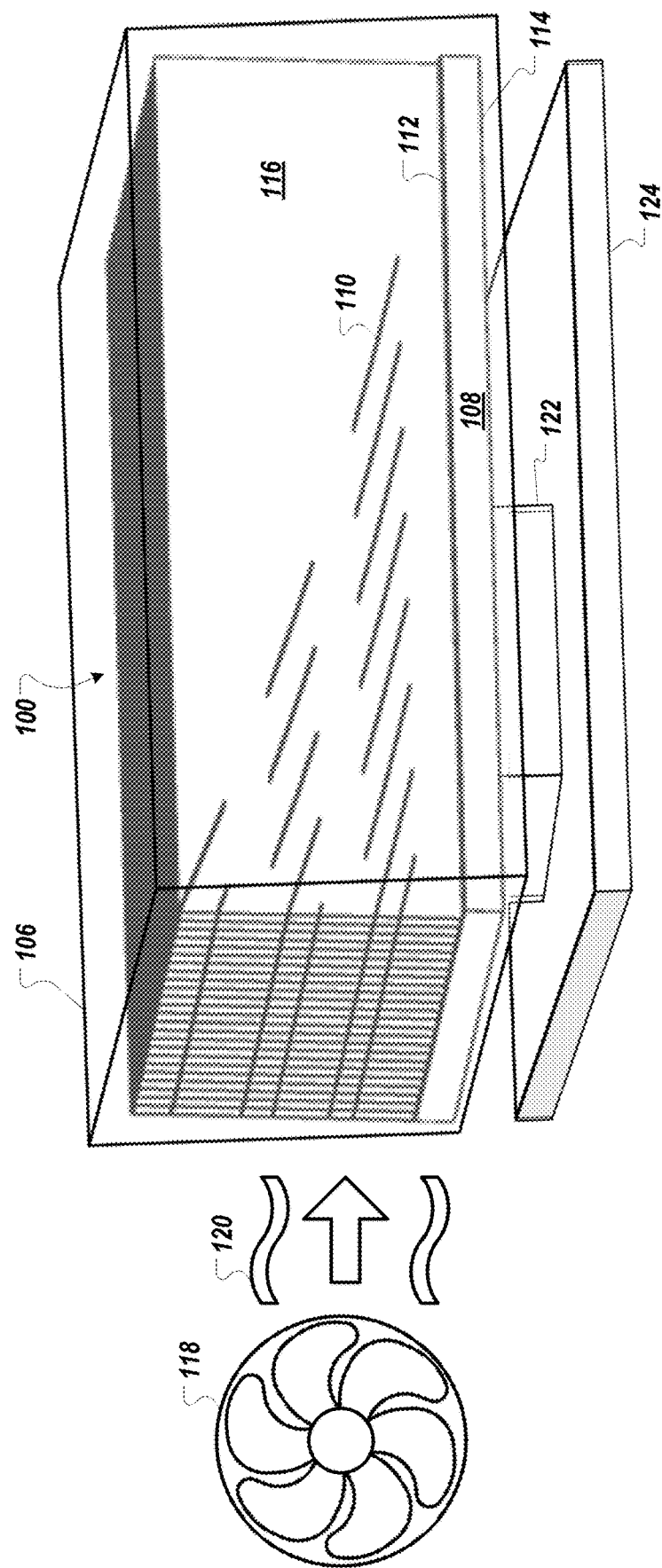
FIG. 1 is a diagram of an example heat sink with fluid control surfaces.

FIG. 1 is a diagram of an example heat sink 100 with fluid control surfaces 110. The heat sink 100 is also described with reference to FIGS. 2 and 3, which depict side-rear and side perspective views of the heat sink 100, respectively.

While many features of the heat sink 100 depicted in the drawings are described, descriptions of some structures depicted in the drawing are omitted for brevity. Furthermore, numbering of like features is omitted to avoid congestion in the drawings.

With reference to FIG. 1, the heat sink 100 includes a base 108 defining a first side. The first side of the base 108 has a base planar surface 112. The base 108 has a second side 114 opposite the first side.

The heat sink 100 has a plurality of planar fins 116 that extend from the base planar surface 112. The fins 116 are dispositioned parallel to each other, and, in this example, extend perpendicularly from the planar surface 112. The fins 116 can include one or more control surfaces 110. As used in this specification, a control surface 110 is a structure extending from a planar surface of a planar fin 116 and that defines a surface at an angle and that directs air flow in a direction determined by the angle. The angle is such that the airflow is directed downward toward a heat load.

The base 108 can be thermally coupled to a heat load 122. The heat load 122 can be, for example, a heat-generating component of a printed circuit board (PCB) 124. In some examples, the heat load 122 is a computer chip. In operation, heat generated by the heat load 122 is conducted from the heat load 122, to the base 108, to the fins 116.

The heat sink 100 is positioned within a duct 106, or otherwise positioned in the direction of a fluid flow. In this example, a fan 118 directs a fluid, e.g., air 120, into the duct 106. The duct 106 can contain the air 120 within a volume around the heat sink 100. The fan 118 may direct the air 120 into the duct 106 at a designated flow rate, e.g., 40 cubic feet per minute (CFM), 64 CFM, or 100 CFM. The air 120 flows through the heat sink 100 within the duct 106. As the air 120 passes through the heat sink 100, heat transfers from the fins 116 to the air 120. In this way, air 120 flowing through the heat sink 100 removes heat from the heat load 122. The air 120 exiting the heat sink 100 is therefore hotter than the air 120 entering the heat sink 100.

Figure 2:
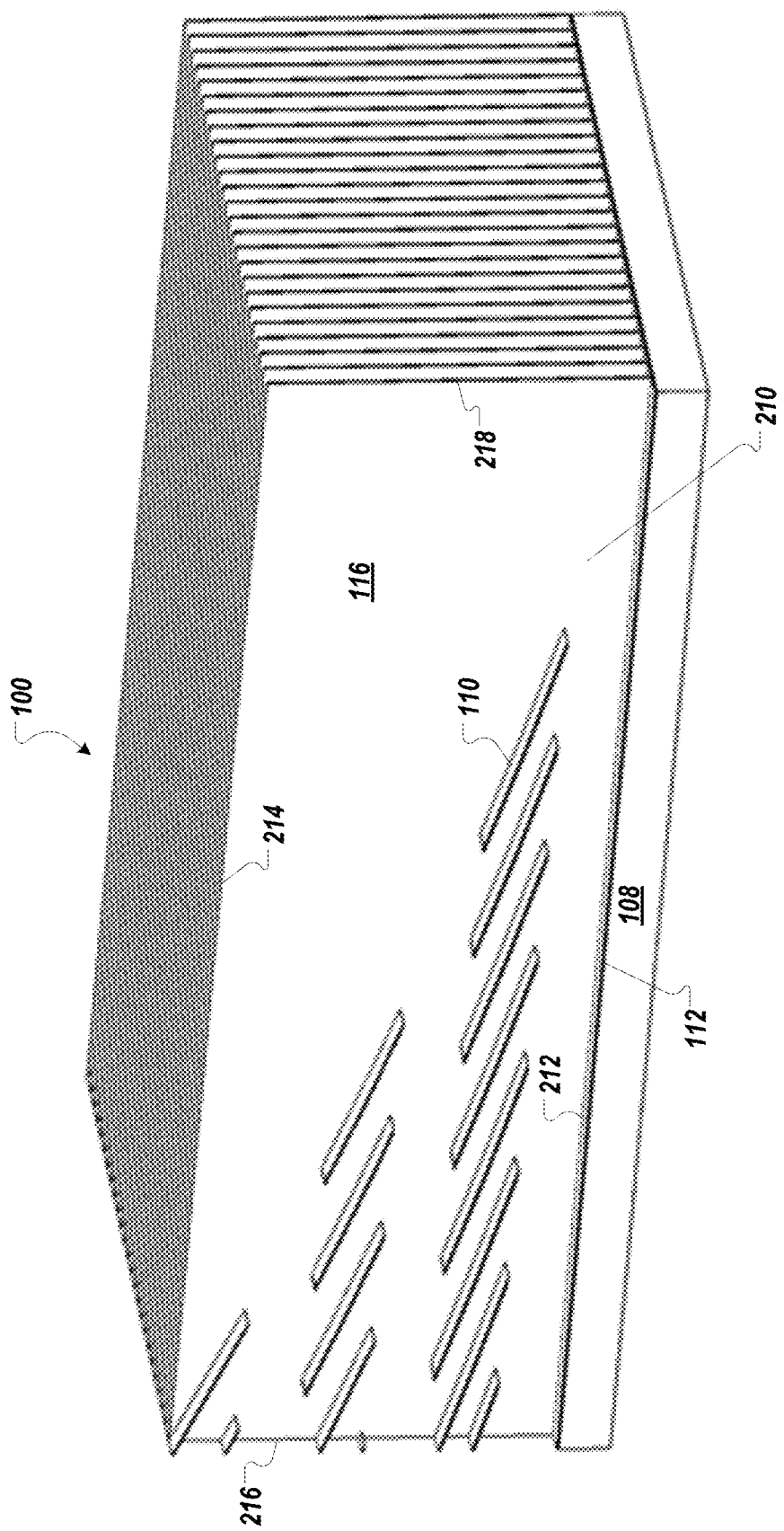
FIG. 2 is a side-rear perspective view of the heat sink.

With reference to FIG. 1 and more specifically to FIG. 2, each fin 116 includes a bottom fin edge 212 that is coupled to the base planar surface 112 of the first side of the base 108. Each fin 116 also includes a top fin edge 214 that is opposite the bottom fin edge 212. Each fin 116 includes a leading fin edge 216 extending from the bottom fin edge 212 to the top fin edge 214, and a trailing fin edge 218 opposite the leading fin edge 216.

In operation, the air 120 enters the heat sink 100 at the leading fin edges 216 of the fins 116. The air 120 exits the heat sink 100 at the trailing fin edges 218 of the fins 116. Thus, for each fin 116, the leading fin edge 216 is defined by fluid ingress, while the trailing fin edge 218 is defined by fluid egress.

Each fin 116 includes a fin planar surface 210 extending from the bottom fin edge 212 to the top fin edge 214, and each fin 116 includes one or more control surfaces 110 extending from the fin planar surface 210. The control surfaces 110 are disposed relative to the fin planar surface 210, the bottom fin edge 212, and the top fin edge 214, such that a fluid flowing from the leading fin edge 216 of the fin 116 is conducted toward the base 108. As shown in FIGS. 1 and 2, the control surfaces are disposed at angles that direct the fluid (air) in a downward direction toward the base 108.

An example heat sink 100 has dimensions of 200 millimeters (mm) long by 100 mm wide by 60 mm tall. Other dimensions can also be accommodated. The first side of the base 108 can define the length and width of the heat sink 100, while the fin planar surface 210 of the fins 116 can define the tallness of the heat sink 100. An example heat sink 100 can be made from a thermally conductive metallic material, e.g., an aluminum alloy.

Figure 3:
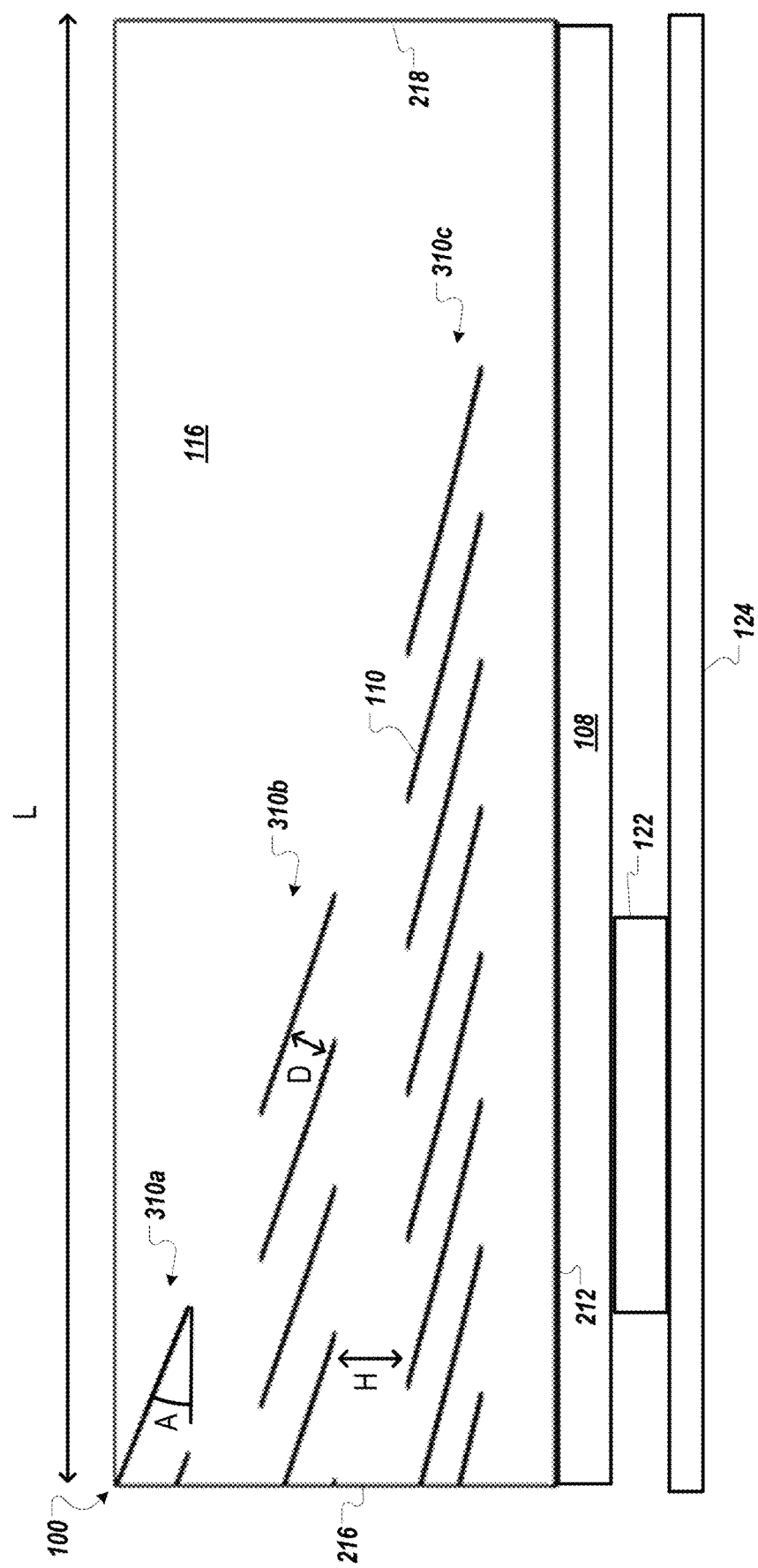
FIG. 3 is a side perspective view of the heat sink.

With reference to FIG. 3, the control surfaces 110 of each fin 116 can be arranged in one or more rows 310a, 310b, 310c ("rows 310"). Although three rows 310 are shown in FIG. 3, a heat sink 100 can include additional rows or fewer rows. For example, a heat sink may include one row, five rows, or seven rows.

The one or more rows 310 can each be horizontally disposed relative to the planar surface of the base 108. Each of the rows 310 extends a part of the length L from the leading fin edge 216 toward the trailing fin edge 218. The row 310c extends a greater part of the length L than the row 310b. The row 310b extends a greater part of the length L than the row 310a. In some examples, one or more rows 310 can extend the entire length L from the leading fin edge 216 toward the trailing fin edge 218.

Each row 310a, 310b, 310c is displaced at a vertical distance from the bottom fin edge 212 that is different from the vertical distance of each other row 310a, 310b, 310c from the bottom fin edge 212. For example, the row 310b is displaced from the bottom fin edge 212 at a greater vertical distance than the row 310c. Similarly, the row 310a is displaced from the bottom fin edge 212 at a greater vertical distance than the rows 310b and 310c. The rows 310 can be spaced apart from each other at a height H in a vertical direction relative to the bottom fin edge 212. The height H can be a value of, for example, 8 mm, 10 mm, or 12 mm. In some examples, the height H between two adjacent rows 310 can be different from the height H between two other adjacent rows 310. For example, the height H between row 310c and row 310b may be different from the height H between row 310b and row 310a.

The rows 310 each include one or more control surfaces 110 that are arranged from the leading fin edge 216 toward the trailing fin edge 218. Each control surface 110 within a row 310 can be positioned at an interval distance from another control surface 110 within the row 310. The control surfaces 110 can be spaced apart from each other at a distance D, as measured perpendicularly relative to planes of the control surfaces 110. The distance D can be a value of, for example, 6 mm, 7 mm, or 8 mm. In some examples, the distance D can be different for control surfaces 110 of a particular row 310 than for control surfaces 110 of another row 310. For example, the distance D can be different for the control surfaces 110 of the row 310a than for the control surfaces 110 of the row 310b.

In some examples, each row 310 can include a different number of control surfaces 110 than a respective number of control surfaces 110 of an adjacent row 310. For example, the row 310a includes two control surfaces 110, the row 310b includes five control surfaces 110, and the row 310c includes eight control surfaces 110. In some examples, two or more of the rows 310 can include the same number of control surfaces 110.

The control surfaces 110 can be mounted at a non-zero angle A relative to the plane of the base 108. In some examples, the angle A for each row can be different from the respective angle A for each other row. For example, the angle A can be different for the control surfaces 110 of the row 310a than for the control surfaces 110 of the row 310b. The angle A can be a value of, for example, 15 degrees, 20 degrees, or 30 degrees.

Figure 4A:
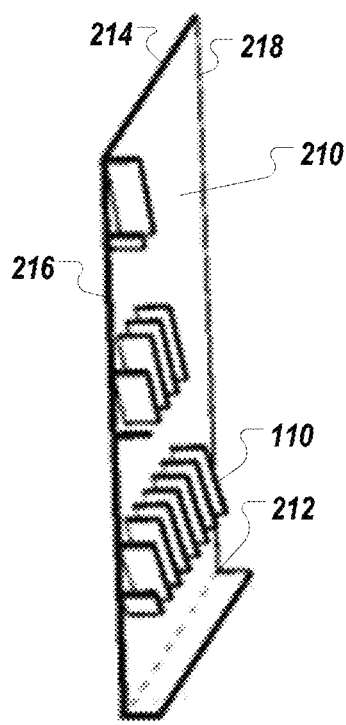
FIGS. 4A and 4B are side-front perspective views of a fin of the heat sink.
Figure 4B:
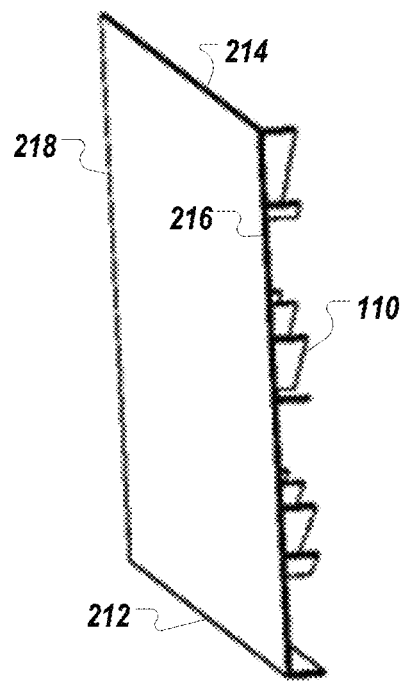

FIGS. 4A and 4B are side-front perspective views of a fin 116 of the heat sink 100. FIG. 4A shows a right-front perspective view of the fin 116. FIG. 4B shows a left-front perspective view of the fin 116.

The control surfaces 110 are mounted on the fin planar surface 210. In some examples, the control surfaces 110 can be mounted on one side of the fin planar surface 210, e.g., a right side, as shown in FIGS. 4A and 4B. In some examples, the control surfaces 110 can be mounted on two sides of the fin planar surface 210, e.g., a right side and a left side. In some examples, the control surfaces 110 can be soldered onto the fin planar surface 210. In some examples, the control surfaces 110 can be embossed in the fin planar surface 210. In yet other examples, the control surfaces 110 can be folded portions of the fin planar surface 210 that have been cut on three sides of a rectangular pattern, and folded on the remaining side of the rectangular pattern.

Figure 5:
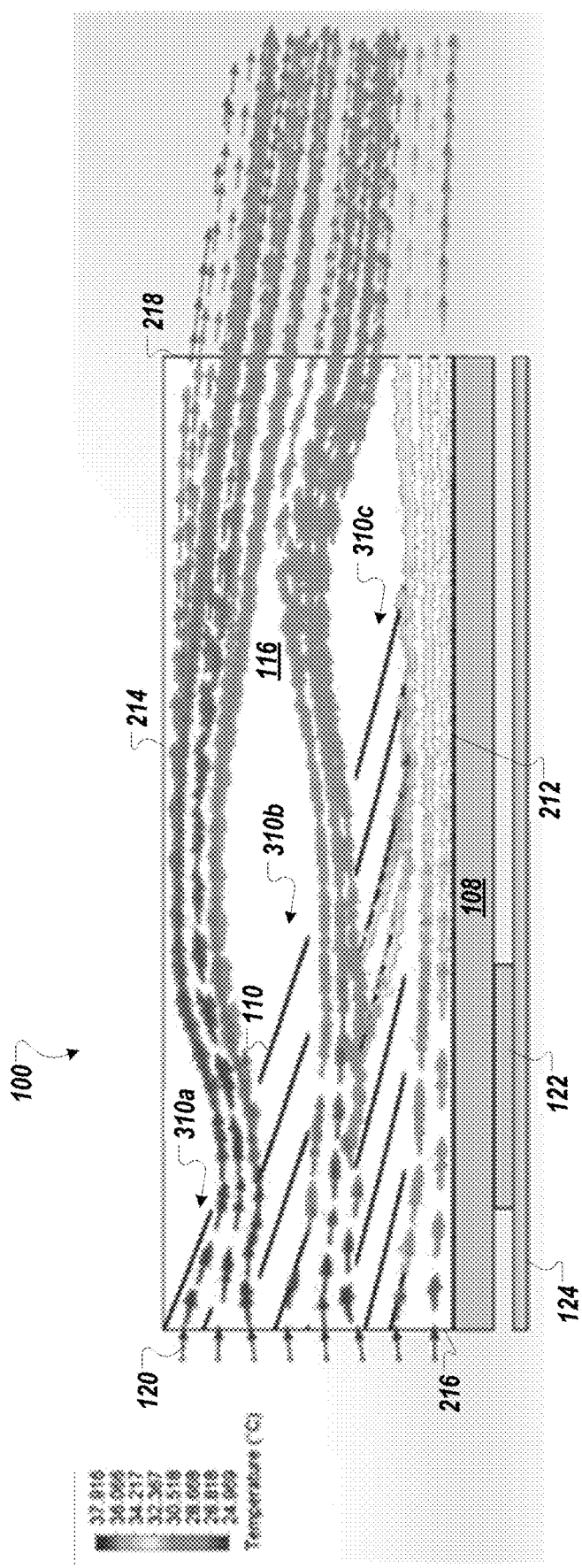
FIG. 5 is a diagram of fluid flow through the heat sink.

FIG. 5 is a diagram of fluid flow through the heat sink 100. FIG. 5 shows a side cross-sectional view of one fin 116 of the heat sink 100. Fluid temperatures are represented in FIG. 5 using a gray scale. In general, darker gray shades represent lower fluid temperatures, and lighter gray shades represent higher fluid temperatures.

In operation, a fluid, e.g., air 120, enters the heat sink 100 at the leading fin edge 216 of the fin 116. The air 120 flows through the heat sink 100 and exits the heat sink 100 at the trailing fin edge 218 of the fin 116. As the air 120 flows through the heat sink 100, the air 120 removes heat from the heat sink 100. Thus, the air 120 exiting the heat sink 100 is at a higher average temperature than the air 120 entering the heat sink 100.

When the air 120 enters the heat sink 100, some of the air 120 contacts control surfaces 110 of each row 310a, 310b, 310c. The control surfaces 110 guide the air 120 toward the base 108. Therefore, the volume of air 120 flowing nearer to the base 108 increases. For example, as the air 120 flow through the heat sink 100, the volume of air 120 flowing between the bottom fin edge 212 and the row 310c increases. Meanwhile, the volume of air 120 flowing between the row 310a and the row 310b decreases, as some of the air 120 is diverted toward the base 108.

As shown in FIG. 5, the air 120 increases temperature as the air 120 flows through the heat sink 100. Thus, the air 120 exiting the heat sink 100 at the trailing fin edge 218 is hotter than the air 120 entering the heat sink 100 at the leading fin edge 216. Additionally, since the base 108 is thermally coupled to the heat load 122, regions of the fin 116 that are closer to the base 108 are generally hotter than regions of the fin 116 that are farther from the base 108. Therefore, air 120 exiting the heat sink 100 at a shorter vertical distance from the base 108 is generally hotter than the air 120 exiting the heat sink 100 at a greater vertical distance from the base 108.

The control surfaces 110 increase the volume of air 120 flowing through the higher-temperature areas of the heat sink 100 that are nearer to the base 108 than would otherwise occur without the control surfaces. Increasing the volume of air 120 flowing nearer to the base 108 can increase the amount of heat removed from the heat sink 100 and/or the rate of heat removal from the heat sink 100. Thus, by directing air 120 towards the base of the heat sink 100, the control surfaces 110 can improve heat removal performance of the heat sink 100.

The heat removal performance of the heat sink 100 can be determined, for example, by measuring a temperature of the heat load 122. A heat sink 100 with the control surfaces 110 can result in a heat load 122 temperature that is lower compared to a similar heat sink 100 without the control surfaces 110.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A heat sink comprising:
a base defining a first side having a base planar surface and a second side opposite the first side; and
a plurality of planar fins extending from the first side of the base in parallel disposition relative to each other, each planar fin of the plurality of planar fins comprising:
a bottom fin edge coupled to the base planar surface;
a top fin edge that is opposite the bottom fin edge;
a leading fin edge extending from the bottom fin edge to the top fin edge;
a trailing fin edge opposite the leading fin edge;
a fin planar surface extending from the bottom fin edge to the top fin edge; and
one or more control surfaces extending from the fin planar surface and disposed relative to the fin planar surface, the bottom fin edge, and the top fin edge such that a fluid flowing from the leading fin edge is conducted toward the base planar surface, the one or more control surfaces being arranged according to a plurality of rows, wherein:
each row of the plurality of rows extends from the leading fin edge toward the trailing fin edge and are horizontally disposed relative to the base planar surface,
each row of the plurality of rows is displaced at a vertical distance from the bottom fin edge different than the respective vertical distance of each other row, and
each of the plurality of rows includes a different number of control surfaces than a respective number of control surfaces of an adjacent row.

2. The heat sink of claim 1, wherein, for each of the plurality of planar fins, the leading fin edge is defined by a fluid ingress, and the trailing fin edge is defined by a fluid egress.

3. The heat sink of claim 1, wherein each of the one or more control surfaces are mounted at a non-zero angle relative to the plane of the base.

4. The heat sink of claim 1, wherein each of the one or more control surfaces in a particular row of the plurality of rows is mounted at a respective angle relative to the plane of the base, and each respective angle for each row is different from the respective angle for each other row.

5. The heat sink of claim 1, wherein the one or more control surfaces are embossed in the fin planar surface.

6. The heat sink of claim 1, wherein the one or more control surfaces are soldered onto the fin planar surface.

7. A planar fin comprising:
a bottom fin edge;
a top fin edge that is opposite the bottom fin edge;
a leading fin edge extending from the bottom fin edge to the top fin edge;
a trailing fin edge opposite the leading fin edge;
a fin planar surface extending from the bottom fin edge to the top fin edge; and
one or more control surfaces extending from the fin planar surface and disposed relative to the fin planar surface, the bottom fin edge, and the top fin edge such that a fluid flowing from the leading fin edge is conducted toward the bottom fin edge, the one or more control surfaces being arranged according to a plurality of rows, wherein:
each row of the plurality of rows extends from the leading fin edge toward the trailing fin edge and are horizontally disposed relative to the bottom fin edge,
each row of the plurality of rows is displaced at a vertical distance from the bottom fin edge different than the respective vertical distance of each other row, and
each of the plurality of rows includes a different number of control surfaces than a respective number of control surfaces of an adjacent row.

8. The planar fin of claim 7, wherein the leading fin edge is defined by a fluid ingress, and the trailing fin edge is defined by a fluid egress.

9. The planar fin of claim 7, wherein each of the one or more control surfaces are mounted at a non-zero angle relative to the bottom fin edge.

10. The planar fin of claim 7, wherein each of the one or more control surfaces in a particular row of the plurality of rows is mounted at a respective angle relative to the bottom fin edge, and each respective angle for each row is different from the respective angle for each other row.

11. The planar fin of claim 7, wherein the one or more control surfaces are embossed in the fin planar surface.

12. The planar fin of claim 7, wherein the one or more control surfaces are soldered onto the fin planar surface.

* * * * *